United States Patent
Wong et al.

(10) Patent No.: US 6,218,844 B1
(45) Date of Patent: Apr. 17, 2001

(54) METHOD AND APPARATUS FOR TESTING AN ARCING FAULT CIRCUIT INTERRUPTER

(75) Inventors: Kon B. Wong; Charles D. Bettis, both of Cedar Rapids, IA (US)

(73) Assignee: Square D Company, Palatine, IL (US)

( * ) Notice: Subject to any disclaimer, the term of this patent is extended or adjusted under 35 U.S.C. 154(b) by 0 days.

(21) Appl. No.: 09/213,082

(22) Filed: Dec. 16, 1998

(51) Int. Cl.[7] .......... G01R 31/14; G01R 31/00; G01R 31/02
(52) U.S. Cl. .......... 324/509; 324/508; 324/424
(58) Field of Search .......... 324/509, 508, 324/522, 424

(56) References Cited

U.S. PATENT DOCUMENTS

| | | |
|---|---|---|
| 3,660,721 | 5/1972 | Baird ......... 361/55 |
| 3,716,757 | 2/1973 | Rodriguez ......... 317/40 |
| 3,932,790 | 1/1976 | Muchnick ......... 317/18 |
| 4,156,846 | 5/1979 | Harrold et al. ......... 324/158 |
| 4,166,260 | 8/1979 | Gillette ......... 335/20 |
| 4,344,100 | 8/1982 | Davidson et al. ......... 361/45 |
| 4,378,525 | 3/1983 | Burdick ......... 324/127 |
| 4,477,855 | 10/1984 | Nakayama et al. ......... 361/54 |
| 4,587,588 | 5/1986 | Goldstein ......... 361/54 |
| 4,631,621 | 12/1986 | Howell ......... 361/13 |
| 4,723,187 | 2/1988 | Howell ......... 361/13 |
| 4,816,958 | 3/1989 | Belbel et al. ......... 361/93 |
| 4,878,144 | 10/1989 | Nebon ......... 361/96 |
| 4,901,183 | 2/1990 | Lee ......... 361/96 |
| 5,168,261 | 12/1992 | Weeks ......... 340/515 |
| 5,257,157 | 10/1993 | Epstein ......... 361/111 |
| 5,334,939 | 8/1994 | Yarbrough ......... 324/424 |
| 5,363,269 | 11/1994 | McDonald ......... 361/45 |
| 5,373,241 | 12/1994 | Ham, Jr. et al. ......... 324/536 |
| 5,388,021 | 2/1995 | Stahl ......... 361/56 |
| 5,459,630 | 10/1995 | Mackenzie et al. ......... 361/45 |
| 5,473,494 | 12/1995 | Kurosawa et al. ......... 361/3 |
| 5,499,189 | 3/1996 | Seitz ......... 364/480 |
| 5,590,010 | 12/1996 | Ceola et al. ......... 361/93 |
| 5,617,019 | 4/1997 | Etter ......... 324/117 |
| 5,638,244 | 6/1997 | Mekanik et al. ......... 361/62 |
| 5,642,052 | * 6/1997 | Earle ......... 324/556 |
| 5,661,645 | 8/1997 | Hochstein ......... 363/89 |
| 5,682,101 | 10/1997 | Brooks et al. ......... 324/536 |
| 5,764,125 | 6/1998 | May ......... 336/92 |
| 5,825,598 | 10/1998 | Dickens et al. ......... 361/42 |
| 5,834,940 | 11/1998 | Brooks et al. ......... 324/424 |
| 5,835,319 | 10/1998 | Welles, II et al. ......... 361/5 |
| 5,835,321 | 10/1998 | Elms et al. ......... 361/45 |
| 5,839,092 | 11/1998 | Erger et al. ......... 702/58 |
| 5,847,913 | 12/1998 | Turner et al. ......... 361/93 |
| 5,886,861 | 3/1999 | Parry ......... 361/42 |
| 5,889,643 | 3/1999 | Elms ......... 361/42 |
| 5,896,262 | 4/1999 | Rae et al. ......... 361/94 |
| 5,905,619 | 5/1999 | Jha ......... 361/93 |
| 5,933,308 | 8/1999 | Garzon ......... 361/62 |
| 5,946,179 | 8/1999 | Fleege et al. ......... 361/93 |
| 5,963,406 | 10/1999 | Neiger et al. ......... 361/42 |
| 5,969,920 | 10/1999 | Mackenzie ......... 361/42 |
| 5,982,593 | * 11/1999 | Kimblin ......... 324/424 |

FOREIGN PATENT DOCUMENTS

| | | | |
|---|---|---|---|
| 0945949A2 | 9/1999 | (EP) | ......... H02H/1/00 |
| 0954003A2 | 11/1999 | (EP) | ......... H01H/83/04 |
| 0158365 | 6/1989 | (JP) . | |

* cited by examiner

Primary Examiner—Safet Metjahic
Assistant Examiner—James C Kerveros
(74) Attorney, Agent, or Firm—Kareem M. Irfan; Larry I. Golden

(57) ABSTRACT

An arcing fault circuit interrupter testing method includes the steps of producing a simulated line to neutral arcing fault signal comprising a relatively large di/dt signal, applying the signal to a branch circuit, and producing an observable indication of operation or lack of operation of an arcing fault circuit interrupter in the branch circuit in response to the simulated line to neutral arcing fault signal. A test apparatus carries out the method.

19 Claims, 3 Drawing Sheets

METHOD AND APPARATUS FOR TESTING AN ARCING FAULT CIRCUIT INTERRUPTER

FIELD OF THE INVENTION

This invention relates generally to the field of protective devices which interrupt electrical circuits in response to the detection of arcing faults, and, more particularly, to a method and apparatus for testing an arcing fault circuit interrupter to verify operation thereof.

BACKGROUND OF THE INVENTION

Electrical systems in residential, commercial and industrial applications usually include a panelboard for receiving electrical power from a utility source and distributing electrical power to one or more branch circuits. The power is generally routed through overcurrent protection devices to designated branch circuits supplying one or more loads. The overcurrent protection devices are typically circuit interrupters such as circuit breakers and fuses which are designed to interrupt the electrical current supplied to the loads if certain predefined limits of the conductors are surpassed.

Circuit breakers are a well-known type of circuit interrupter which are often selected because a resetting mechanism allows their reuse. Typically, circuit breakers interrupt an electric circuit due to a disconnect or trip condition such as a current overload or ground fault. The current overload condition results when a current exceeds the continuous rating of the breaker for a time interval determined by the trip curve. The ground fault trip condition is created by an imbalance of currents flowing between a line conductor and a neutral conductor such as by a grounded conductor, or other current path to ground, or sometimes, by an arcing fault to ground.

However, arcing faults are often undetected by standard circuit breakers. An arcing fault is defined as current through ionized gas between two ends of a broken conductor, between two conductors supplying a load, or between a conductor and ground. Upon occurrence of an arcing fault, branch or load impedance may cause the current levels to be reduced to a level below the trip curve settings of the circuit breaker, causing the arcing fault condition to be undetected by the circuit breaker. In addition, an arcing fault which does not contact a grounded conductor or other grounded point will not trip a ground fault protected circuit.

There are many conditions that may cause an arcing fault, for example, corroded, worn or aged wiring or insulation, loose connections, wiring damaged by nails or staples through the insulation, and electrical stress caused by repeated overloading, lightning strikes, etc. These faults may damage the conductor insulation and/or create an unacceptably high temperature in the conductor.

Arcing fault detection systems/arcing fault circuit interrupters (AFCI) known in the art generally sense the current passing through the line conductor of a branch circuit, process the sensed information to determine whether the characteristics of the line current represent the occurrence of an arcing fault, and trip open the branch circuit if an arcing fault has occurred. Several arcing fault detection systems of this type are described in U.S. Pat. No. 5,682,101, in pending U.S. patent application Ser. No. 09/026,193 entitled "Electrical Fault Detection System" (Attorney's Docket NBD-27/SQRE020), and in pending U.S. patent application Ser. No. 09/129,685 (Attorney's Docket NBD-27-1/SQRE171) entitled "Arc Fault Detection System," all of which are assigned to the assignee of the present invention and are incorporated herein by reference. The arcing fault detection system may sense electrical properties other than line current.

There is a need for a simple and effective method and system to facilitate testing of an arcing fault circuit interrupter in a branch circuit. The present invention is directed to providing such a method and system. It is capable of producing simulated arcing faults in the branch circuit and determining whether the arcing fault detector trips i.e., interrupts the circuit in response to the simulated arcing condition. In one embodiment, the apparatus of the invention is capable of being enclosed within a relatively small, portable housing to facilitate independent testing of multiple branch circuits.

SUMMARY OF THE INVENTION

In accordance with one aspect of the invention an arcing fault circuit interrupter tester apparatus comprises an arcing fault signal circuit for producing a simulated line to neutral arcing fault signal and a simulated line to ground arcing fault signal. A switch separately selects said simulated line to neutral arcing fault signal and said simulated line to ground arcing fault signal, and an output connector applies the selected signal to a branch circuit. An indicator produces an observable indication of the operation or non-operation of an arcing fault circuit interrupter in the branch circuit in response to each of said simulated line to neutral arcing fault signal and said simulated line to ground arcing fault signal.

In accordance with another aspect of the invention an arcing fault circuit interrupter test apparatus comprises a signaling circuit which produces a simulated line to neutral arcing fault signal comprising a relatively large di/dt signal, an output connector which applies the signal to a branch circuit, and an indicator which produces an observable indication of operation or non-operation of an arcing fault circuit interrupter in the branch circuit in response to the simulated line to neutral arcing fault signal.

In accordance with another aspect of the invention an arcing fault circuit interrupter testing method comprises producing a simulated line to neutral arcing fault signal and a simulated line to ground arcing fault signal, separately selecting the simulated line to neutral arcing fault signal and said simulated line to ground arcing fault signal, applying the selected signal to a branch circuit, and producing an observable indication of operation or lack of operation of an arcing fault circuit interrupter in said branch circuit in response to each of the simulated line to neutral arcing fault signal and the simulated line to ground arcing fault signal.

In accordance with another aspect of the invention an arcing fault circuit interrupter testing method comprises producing a simulated line to neutral arcing fault signal comprising a relatively large di/dt signal, applying the signal to a branch circuit, and producing an observable indication of operation or lack of operation of an arcing fault circuit interrupter in said branch circuit in response to the simulated line to neutral arcing fault signal.

DETAILED DESCRIPTION OF THE ILLUSTRATED EMBODIMENT

Figure 1A:
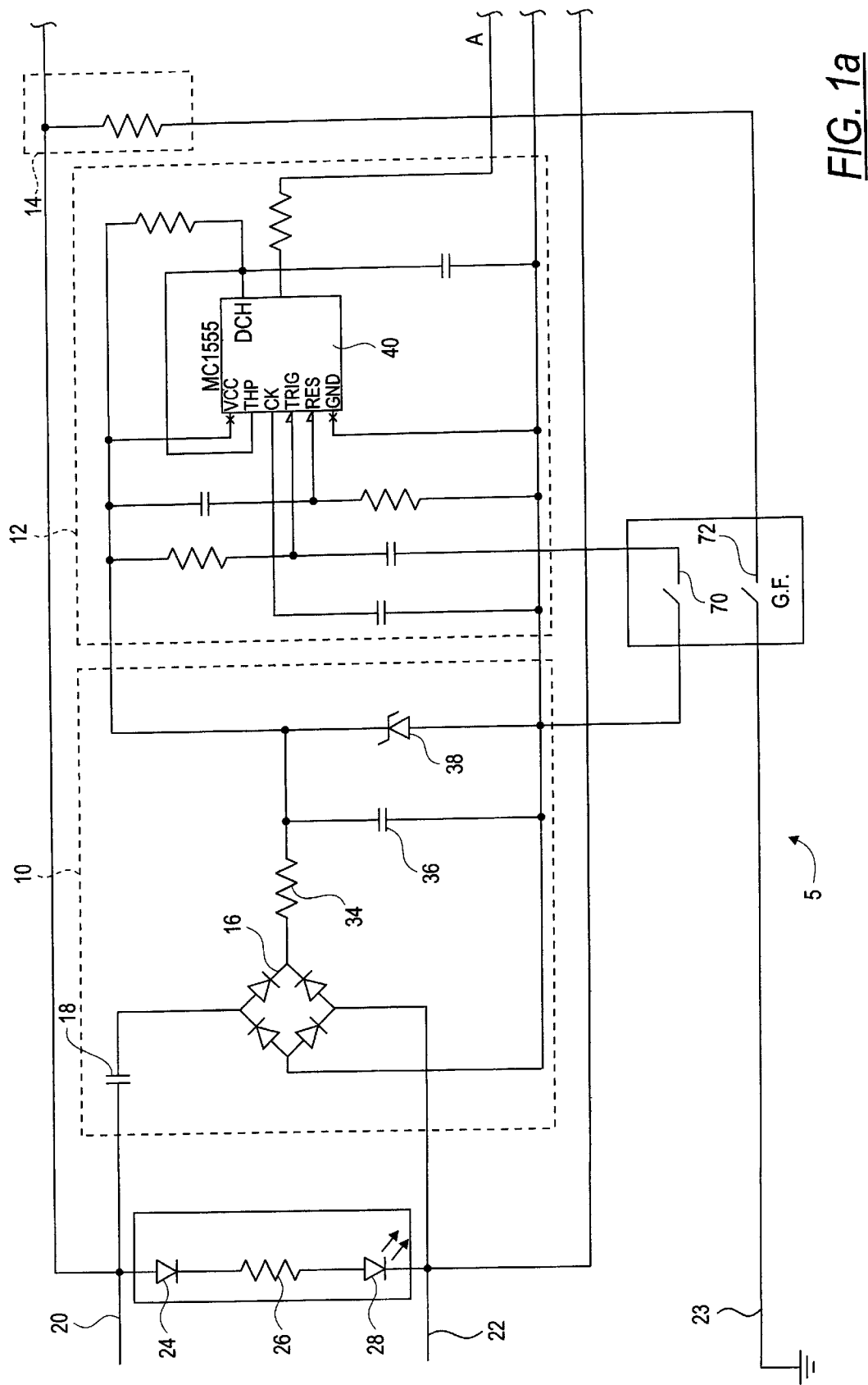
FIGS. 1a and 1b form a schematic circuit diagram of a test apparatus in accordance with one embodiment of the invention.

Referring now to the drawings, and initially to FIG. 1a, there is shown a tester having a power supply circuit portion 10, a one-shot timer circuit portion 12, and a ground fault resistor 14 which form portions of the test apparatus of the invention. The power supply 10 includes a diode bridge 16 which is coupled in series with a voltage dropping capacitor 18 across line and neutral terminals 20, 22 of the circuit. The line, neutral and ground terminals 20, 22 and 23 may be coupled to a branch circuit in any desired fashion. However, in accordance with one aspect of the invention and referring briefly to FIG. 2, the line, neutral and terminals 20, 22 and 23 are coupled to a branch circuit by the expedient of mounting the circuits of FIGS. 1a and 1b in an enclosure or housing 30 and providing a conventional projecting threeprong AC plug 32 to engage an AC wall outlet or receptacle 33, to thereby test a branch circuit from its circuit interrupter to the outlet where the tester 5 is plugged in. As shown in FIG. 2, the housing 30 may be relatively small, so that the tester is a small, portable hand-held device.

Referring again to FIG. 1a, indicator circuit includes a diode 24 and a current limiting resistor 26 in series with an indicator element which in the illustrated embodiment takes the form of an LED 28. The LED 28 may be arranged to be visible externally of the housing 30 of the plug-in module of FIG. 2. The power supply provides a suitable DC voltage to the one-shot timer circuit 12 by way of an RC smoothing circuit comprising resistor 34 and a capacitor 36. A zener diode 38 defines the DC voltage level at a DC voltage input VCC of a timer circuit 40. The timer circuit 40 in the illustrated embodiment comprises an integrated circuit (IC) of the type generally designated MC 1555. Suitable passive RC components are coupled with various terminals of the timer circuit IC, and a ground connection for the IC is also provided to the negative end of the diode bridge 16. An output of the one-shot timer circuit designated at circuit point A is fed to be like-designated circuit point of the circuit portion shown in FIG. 1b.

Figure 1B:
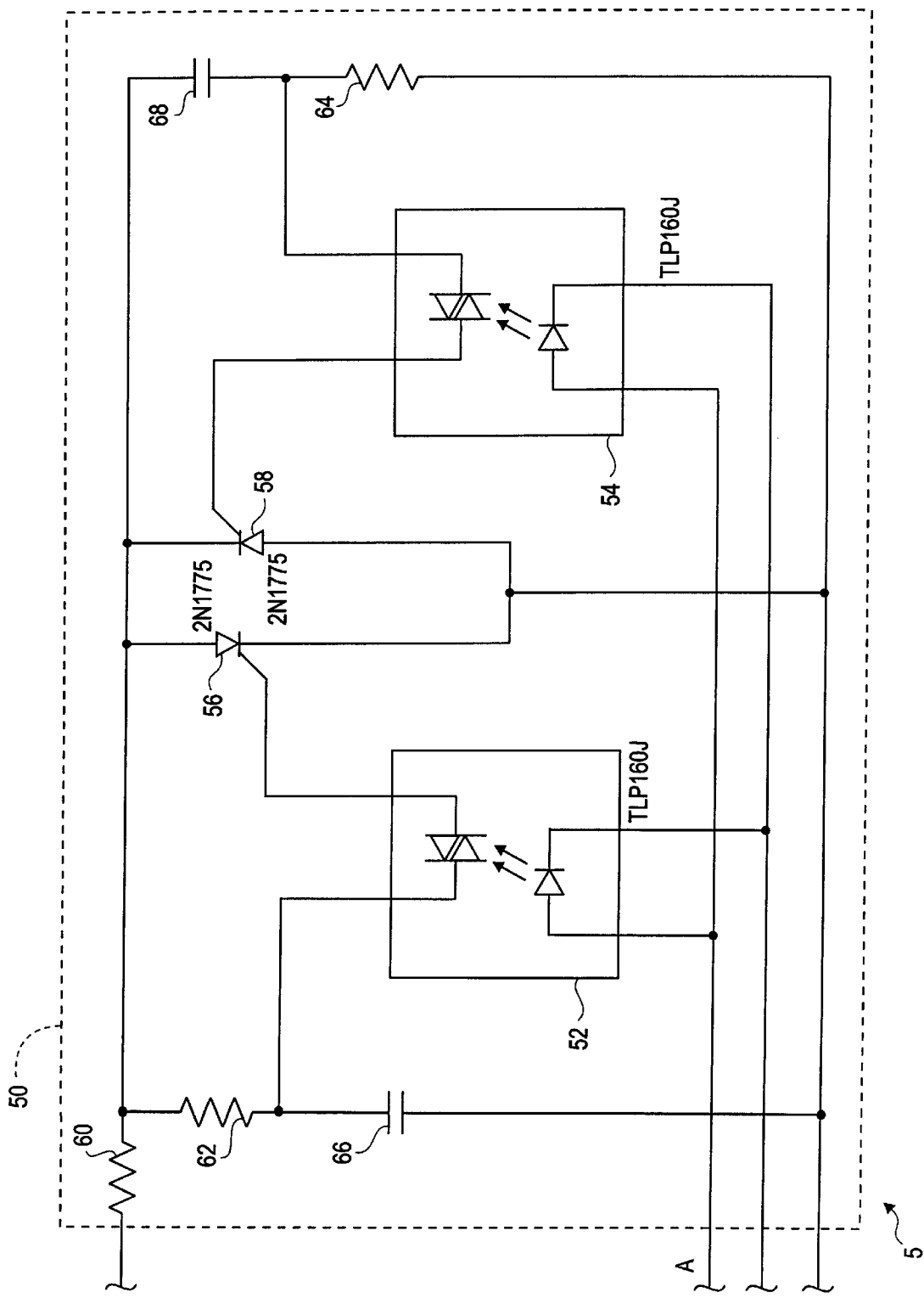
Figure 2:
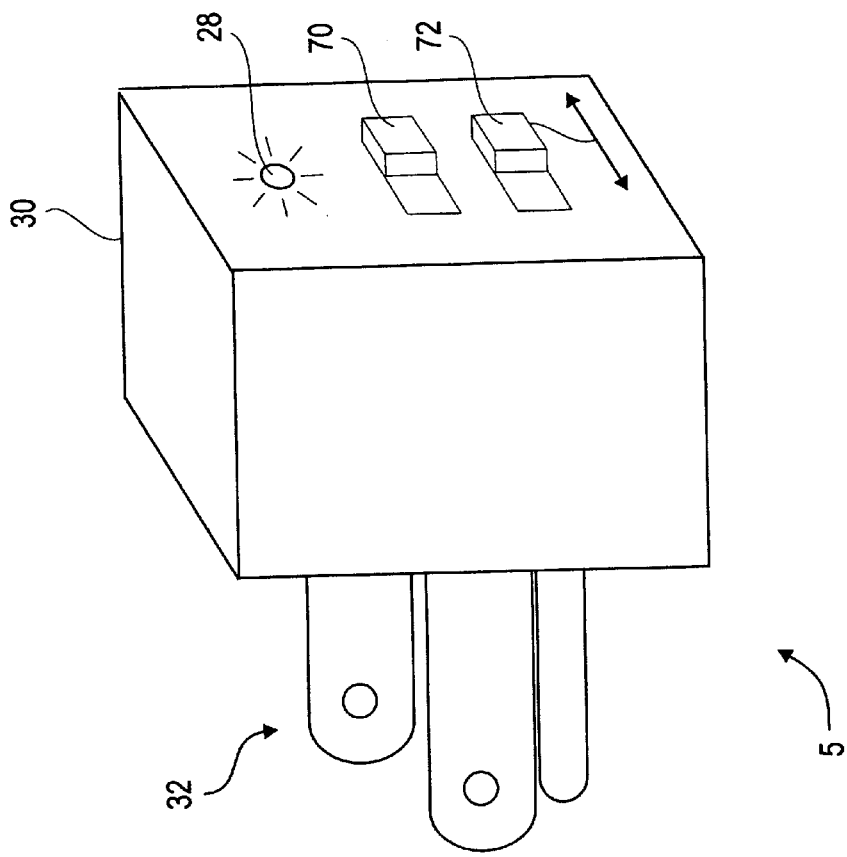
FIG. 2 is a perspective view of a housing or module which may house a test apparatus in accordance with one embodiment of the invention.
Figure 2:
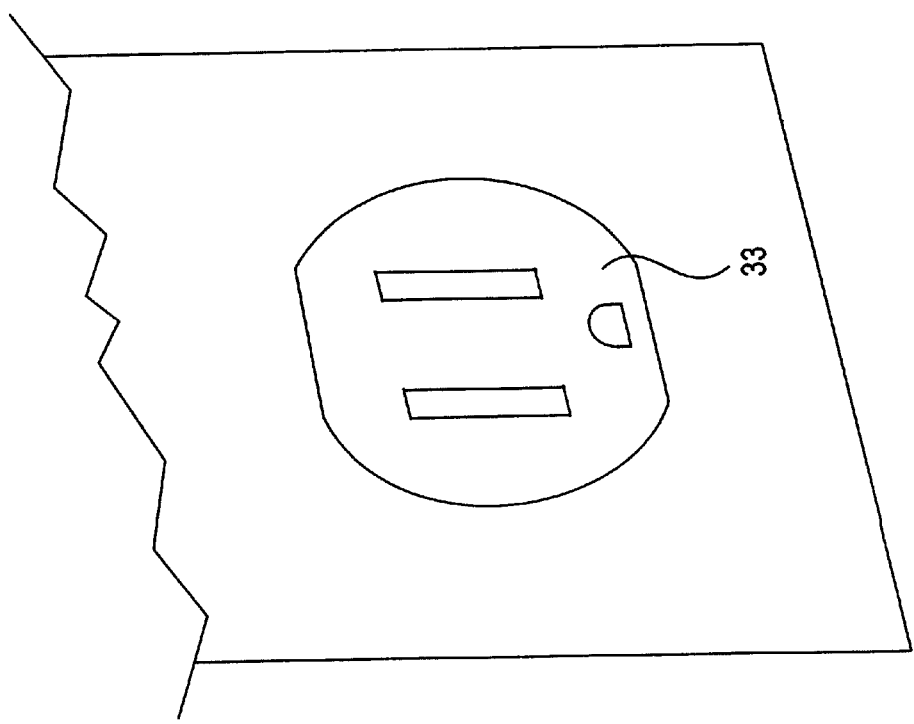

FIG. 1b illustrates a di/dt current generator circuit 50 which includes a pair of opto-isolator circuits 52 and 54 which have LED portions connected in like polarity between the circuit point A (the output of the one shot timer) and the negative side of the diode bridge 16. Respective outputs of the opto-isolators 52 and 54 drive respective gate inputs of a pair of SCR or triac switching elements 56 and 58 which are coupled in opposite polarity across the line and neutral terminals 20, 22 in series with a current limiting resistor 60, which is interposed between the line terminal and the triac switching elements 56 and 58. Respective resistors 62, 64 and capacitors 66, 68 complete the circuit 50.

In operation, the one-shot timer 12 and the di/dt current generator 50, when activated, simulate a line to neutral fault as a di/dt signal between line and neutral. In the illustrated embodiment, these components are selected and adjusted such that the triacs 56 and 58 are turned on for eight half cycles of the AC line, with the RC components 62, 66 and 64, 68 giving a 90° phase-firing current to maximize the di/dt output of the circuit across the line and neutral terminals. These circuits are energized by triggering the one shot timer circuit 40 through a "di/dt" switch 70 shown in FIG. 1a. In one example, the di/dt signal is at least 0.328 of peak current/500 microseconds. This is designed to test an arc fault interrupter having a di/dt limit of about 0.04 amps per microsecond at 60 amps.

A line to ground arc is simulated by injecting a 50 milli-amp ground fault into the circuit. This is done by switching the ground fault resistor 14 into series circuit between line and ground by means of a "ground fault" (G.F.) switch 72.

Referring again briefly to FIG. 2, in accordance with the embodiment illustrated therein, the test apparatus of the invention is embodied as a relatively small hand-held, portable device. The tester can be readily plugged into a receptacle in a branch circuit to be tested. However, it should be understood that the tester 30 may be provided with other means for coupling to line and neutral conductors of the branch circuit to be tested without departing from the invention. For example, clips, probes, or other connecting elements might be utilized if desired.

In operation, the module 30 is first coupled with a branch circuit to be tested. Next, one of the switches 70 and 72 is closed to produce either the di/dt line-to-neutral simulated arc signal or the line to ground (ground fault) simulated arc signal. Upon application of either of these simulated arcing signals, any arc fault circuit interrupter associated with the branch circuit should be activated or "tripped" to open or "interrupt" the circuit between line and neutral. If this occurs, the LED 28 should turn off. Should the LED 28 remain illuminated, it may indicate either malfunction of or absence of an arcing fault interrupter in that branch circuit.

When the tester 5 is initially plugged into the outlet, if that branch circuit is powered up, the LED 28 will illuminate. If the LED does not initially illuminate, the circuit breaker associated with that branch circuit should be checked and closed, if it is in a tripped or open condition. If the LED still does not light, the tester 5 should be checked.

What has been illustrated and described herein is a novel and improved trust apparatus and associated method for testing operation of an arc fault circuit interrupter. It will be appreciated that the method of the invention includes producing one or both of simulated line to neutral and line to ground arcing fault signals, applying one or both of the signals to a branch circuit and producing an observable indication of operation or non-operation of an arcing fault circuit interrupter in response to one or both of the simulated line to neutral and line to ground arcing fault signals.

While particular embodiments and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

What is claimed is:

1. An apparatus for testing arcing fault interruption protection of a branch circuit, comprising:

arcing fault signaling means for producing a simulated line to neutral arcing fault signal and a simulated line to ground arcing fault signal;

means for separately selecting said simulated line to neutral arcing fault signal and said simulated line to ground arcing fault signal;

plug in connector means for removably connecting the tester apparatus to a branch circuit so as to apply the selected signal to said branch circuit;

indicator means coupled in circuit with said connector means and responsive to presence or absence of a line voltage across said branch circuit for producing an observable indication of operation or lack of operation of an arcing fault circuit interrupter in said branch circuit in response to each of said simulated line to neutral arcing fault signal and said simulated line to ground arcing fault signal; and a relatively small, portable hand-held housing for enclosing said tester apparatus, said connector means being coupled with said housing.

2. The apparatus of claim 1 wherein said connector means comprises an AC plug projecting from said housing for mating with an AC receptacle of a branch circuit of an electrical system.

3. The apparatus of claim 1 wherein said line to neutral arcing fault signal comprises a relatively large di/dt signal.

4. The apparatus of claim 1 wherein said simulated line to ground arcing signal comprises a simulated ground fault signal.

5. The apparatus of claim 1 wherein said indicator means comprises a LED.

6. The apparatus of claim 1 wherein said means for selecting comprises a switch.

7. An apparatus for testing arcing fault interruption protection of a branch circuit comprising:

signaling means for producing a simulated line to neutral arcing fault signal comprising a relatively large di/dt signal;

connector means removably connectable to a branch circuit to be tested or applying said signal to the branch circuit;

indicator means for producing an observable indication of operation or lack of operation of an arcing fault circuit interrupter of said branch circuit in response to said simulated line to neutral arcing fault signal; and a portable hand-held housing for enclosing said test apparatus; said connector means being coupled with said housing.

8. The apparatus of claim 7 wherein said connector means comprises an AC plug projecting from said housing for mating with an AC receptacle.

9. An for testing arcing fault interruption protection of a branch circuit apparatus, comprising:

an arcing fault signal circuit which produces a simulated line to neutral arcing fault signal and a simulated line to ground arcing fault signal;

a switch for separately selecting said simulated line to neutral arcing fault signal and said simulated line to ground arcing fault signal;

an output connector which removably connects said tester apparatus to a branch circuit and applies the selected signal to the branch circuit;

an indicator coupled in circuit with said connector which produces an observable indication of operation or non-operation of an arcing fault circuit interrupter in said branch circuit in response to each of said simulated line to neutral arcing fault signal and said simulated line to ground arcing fault; and a portable hand-held housing for enclosing said tester apparatus.

10. The apparatus of claim 9 wherein said output connector comprises an AC plug projecting from said housing for mating with an AC receptacle of a branch circuit of an electrical system.

11. The apparatus of claim 9 wherein said line to neutral arcing fault signal comprises a relatively large di/dt signal.

12. The apparatus of claim 9 wherein said simulated line to ground arcing signal comprises a simulated ground fault signal.

13. The apparatus of claim 9 wherein said indicator comprises a light which is coupled across the output connector so as to be energized when the current flows in the branch circuit and de-energized when the branch circuit is interrupted.

14. An apparatus for testing arcing fault interruption protection of a branch circuit comprising:

a signaling circuit which produces a simulated line to neutral arcing fault signal comprising a relatively large di/dt signal;

an output connector which removably connects said tester apparatus to a branch circuit and applies said signal to the branch circuit;

an indicator coupled in circuit with said connector which produces an observable indication of operation or non-operation of an arcing fault circuit interrupter in said branch circuit in response to said simulated line to neutral arcing fault signal; and a portable hand-held housing for enclosing said test apparatus.

15. The apparatus of claim 14 wherein said output connector comprises an AC plug projecting from said housing for mating with an AC receptacle of a branch circuit of an electrical system.

16. A method for testing a branch circuit for line to ground and line to neutral arcing fault interruption protection comprising:

producing a simulated line to neutral arcing fault signal and a simulated line to ground fault signal;

separately selecting said simulated line to neutral arcing fault signal and said simulated line to ground fault signal;

applying the selected signal to a branch circuit; and producing an observable indication of operation or lack of operation of an arcing fault circuit interrupter in said branch circuit in response to each of said simulated line to neutral arcing fault signal and said simulated line to ground arcing fault signal.

17. The method of claim 16 wherein said line to neutral arcing fault signal comprises a relatively large di/dt signal.

18. The method of claim 16 wherein said simulated line to ground arcing signal comprises a simulated ground fault signal.

19. A method for testing a branch circuit for ground arcing fault interruption protection comprising:

producing a simulated line to neutral arcing fault signal comprising a relatively large di/dt signal;

applying said signal to a branch circuit; and producing an observable indication of operation or lack of operation of an arcing fault circuit interrupter in said branch circuit in response to said simulated line to neutral arcing fault signal.

* * * * *